United States Patent [19]

Hamblen

[11] 4,429,274

[45] Jan. 31, 1984

[54] WIRE LOCATOR DEVICE HAVING A DIODE MATRIX BOARD WITH LIGHT PAIR INDICATORS

[75] Inventor: Thomas R. Hamblen, Indianapolis, Ind.

[73] Assignee: Hamblen Gage Corp., Indianapolis, Ind.

[21] Appl. No.: 160,979

[22] Filed: Jun. 19, 1980

[51] Int. Cl.³ .................... G01R 19/00; G01R 31/02
[52] U.S. Cl. .................................................. 324/66
[58] Field of Search ................... 324/66; 340/825.79, 340/825.81, 825.82, 825.85

[56] References Cited

U.S. PATENT DOCUMENTS

| | | |
|---|---|---|
| 1,738,710 | 12/1929 | Jones . |
| 3,440,531 | 4/1969 | Jasorka et al. . |
| 3,470,467 | 9/1969 | Cammer et al. . |
| 3,609,538 | 9/1971 | Schag . |
| 3,867,692 | 2/1975 | Esch . |
| 4,041,383 | 8/1977 | Howard ............................ 324/66 |

FOREIGN PATENT DOCUMENTS

| | | | |
|---|---|---|---|
| 709737 | 6/1954 | United Kingdom ................ 324/66 |
| 482919 | 8/1975 | U.S.S.R. ............................. 324/66 |

*Primary Examiner*—Gerard R. Strecker
*Assistant Examiner*—Walter E. Snow

*Attorney, Agent, or Firm*—Woodard, Weikart, Emhardt & Naughton

[57] ABSTRACT

A portable wire locator device for sequential identification of conductors within a cable includes a diode matrix board arranged with a plurality of wire-receiving terminals which are arranged into evenly spaced rows and columns, a plurality of lights arranged into a row of lights and into a column of lights and a source of electrical power. The source of electrical power is a battery and is coupled in parallel to the lights in the row and the lights in the column which in turn are coupled to the various wire-receiving terminals of the matrix board. Each wire-receiving terminal is coupled through a first diode to one light of the row and through a second diode to one light of the column so that each wire-receiving terminal corresponds to one and only one pair of lights. Similarly, each pair of lights corresponds to one and only one wire-receiving terminal. Wire identification by means of the locator device is performed by first connecting each identified wire at one end of a conduit to a different wire-receiving terminal. Next, the opposite end of the conduit is sequentially contacted, one wire at a time, by the opposite side of the battery. As each unidentified wire end is contacted, a different pair of lights will illuminate. The grid intersection corresponding to that pair of lights indicates the wire identification.

13 Claims, 7 Drawing Figures

4,429,274

WIRE LOCATOR DEVICE HAVING A DIODE MATRIX BOARD WITH LIGHT PAIR INDICATORS

BACKGROUND OF THE INVENTION

This invention relates in general to wire identification devices and in particular to portable, self-contained apparata suitable for use in quickly identifying wire ends at the exposed ends of a larger cable or conduit.

In various electrical assembly and repair or troubleshooting circumstances, it may be desirable, if not absolutely necessary, to select one wire of a cable and thereafter be able to quickly locate the opposite end of that same wire. One means to achieve this objective is to couple the selected wire end to a circuit and then arrange the unidentified wire ends of the larger conduit into a portion of the same circuit which sequentially checks each wire until the circuit is closed. Indicator means, such as a light, signifies when the correct wire end has been located by this sequential checking.

While the above represents a very general concept or function, the structures presently available to achieve this desired result each include aspects which make the device either awkward to use, time consuming, expensive to construct, or of questionable reliability. Further, many devices are extremely complicated because their intended use and function involve a great deal more than simply continuity testing. Listed below are patents which disclose structures generally relating to the above function. While each disclosed device is arguably relevant, none are believed anticipatory of the invention disclosed hereinafter.

| Pat. No. | Patentee | Issue Date |
| --- | --- | --- |
| 1,738,710 | Jones | 12/10/29 |
| 3,470,467 | Cammer et al. | 9/30/69 |
| 3,867,692 | Esch | 2/18/75 |
| 3,609,538 | Schag | 9/28/71 |
| 3,440,531 | Jasorka et al. | 4/22/69 |

Jones discloses a method for identifying cabled wires which are attached to the terminals of a multiple-connection device. The associated structure involves a circuit box having a socket receptacle wired into parallel circuits with a separate light for each circuit and a battery for providing the necessary power. The cable to be identified is plugged into the receptacle and the loose wire ends are connected to one side of the battery in a sequential manner. When a particular light illuminates, it indicates that the selected wire corresponds to that light which in turn corresponds to a particular pin of the socket receptacle. The disadvantages with this type of device are that a plug and socket receptacle are required and size limitation controls the number of wires that can be tested. Further, since each light circuit is a single parallel system, one light is required for each wire to be tested and thus with large bundles of wires, the number of lights becomes excessive as well as the space and cost. In many applications, the number of wires will vary and thus, a different-style plug and receptacle are needed. This limitation makes the device very limited in scope.

Cammer et al. discloses a pin intersection verification system which responds to a repeated occurrence of a predetermined voltage on one of the pins. The circuitry involved in this device is somewhat complicated in that data derived signals are applied to a pin location display panel and to addressing circuits. Registers are employed in which wiring data from punched tape is stored. This type of device is intended primarily for wire wrap panels and is not believed to be overly relevant to the present invention.

Esch discloses a cable conductor identification apparatus which includes an electrical power source sequentially connected to each one of a predetermined number of conductors in a cable at a first terminal end. Also enclosed is a readout device connectable to any selected one of the conductors at a second terminal end. A sequentially pulsed diode matrix provides a discrete number of pulses at each of a predetermined number of terminals that are each connected to a respective conductor of the cable. The primary disadvantage with this type of device is the complexity and the number of steps that must be performed in order to properly check out or identify the wires of the conduit. One such tedious or time-consuming step is the identification of conductor 26 and the specification of this patent indicates that identification of conductor 26 is most conveniently performed by trial and error. Since the identification of conductor 26 is the initial step in testing out the entire cable, this requirement alone is believed to make this apparatus unsuitable for easy and efficient wire identification.

Schag discloses a wire detector device for determining the designation of a wire in a random bundle of wires which are connected at a first end to a group of designatory points. The detector includes connection means between the group of designatory points and a display device and a probe for contacting the second end of a wire in the bundle which is coupled to the display device to complete a circuit through the selected wire thereby causing the display device to indicate the designation. Again, this type of device is somewhat complicated, both mechanically as well as electrically, and includes a number of components and required connections and specific types of connection means which do not result in a very convenient or universal type of system which is easily adapted to almost any testing or wiring situation.

Jasorka et al. discloses a surface wiring assist device including a frame which supports a row of lamps and an electrical device having terminals extending from one side thereof. Each terminal is associated with a different one of the lamps in the row of lamps. The device is intended to supply visual information for assisting in the selection of terminals which are to be wired. Again, the complexity, both mechanical and electrical, is overwhelming, and while various unique capabilities may be afforded, this is not believed to be the ideal type of system for merely identification of the wires of a conduit.

None of the devices disclosed by the above listed patents provide a quick connect/disconnect device which is arranged into a diode grid matrix for rapid determination of wire identification. Not one of the disclosed systems enables the quick connection of all wires at one end of the conduit and then a rapid sequential check on a one-by-one basis of the wires at the opposite end of the conduit. The systems disclosed either involve a fairly specific utilization such as for wire wrap panels or have become so complicated by the additional capabilities desired, such as for example, numerical identification of the wires that system ease and simplicity has been lost. It would thus be an improvement to provide a wire identification device which could be used for quickly connecting to and testing the wires of a conduit and which would be suitable for a wide variety of conduits and wires and for utilization with a number of different systems. The invention disclosed herein provides such an improved device as will be apparent from the following description.

SUMMARY OF THE INVENTION

A wire locator device for sequential identification of conductors within a cable according to one embodiment of the present invention comprises a matrix board having a plurality of wire-receiving terminals arranged into rows and columns, a plurality of light pairs, each light pair being electrically connected to a different one of the plurality of wire-receiving terminals and a source of electrical power, one side of which is coupled to each light in the plurality of light pairs, a particular light pair being illuminated by electrical coupling of the corresponding wire-receiving terminal to the opposite side of the source of electrical power.

One object of the present invention is to provide an improved wire locator device.

Related objects and advantages of the present invention will be apparent from the following description.

DESCRIPTION OF THE PREFERRED EMBODIMENT

Figure 1:
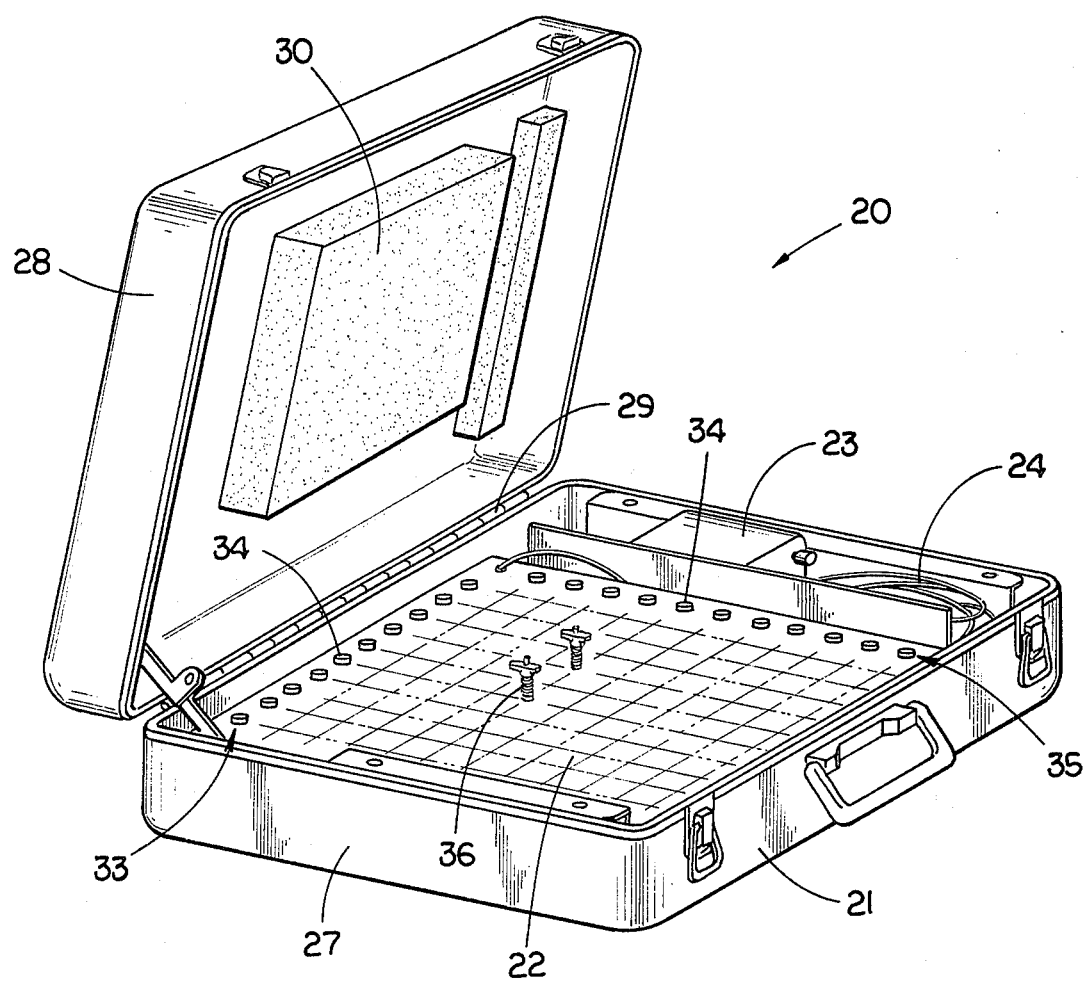
FIG. 1 is a perspective view of a wire locator device according to a typical embodiment of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 2:
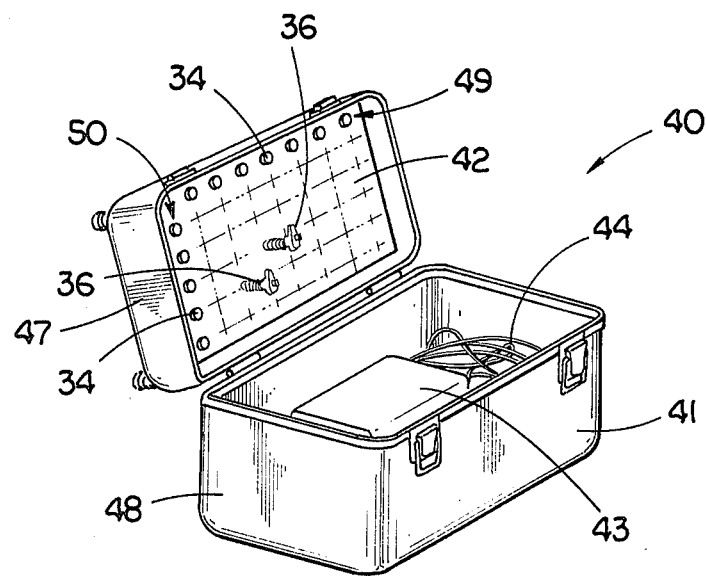
FIG. 2 is a perspective view of a wire locator device according to a typical embodiment of the present invention.

Referring now to FIGS. 1 and 2, there are illustrated two wire locator devices according to typical embodiments of the present invention. Wire locator device 20 (FIG. 1) includes rigid case 21, diode matrix board 22, battery 23 and connection wiring 24.

The case includes a storage half 27, into which the diode matrix board is secured, and a lid 28 which is hinged (hinge 29) to storage half 27. Within lid 28 is a foam rubber cushion 30 for protection of the lights and terminals associated with the diode matrix board. Matrix board 22 includes a row 33 of lights 34 oriented on equal spacing across the top edge portion of the board and a column 35 of lights 34 also on equal spacing along the right side portion of the board.

In the exemplary embodiment, lights 34 are light-emitting diodes and the lights in the row are mutually exclusive of the lights in the column. The equal spacings between the plurality of lights creates a matrix arrangement wherein each intersection of the matrix corresponds to one and only one unique pair of lights. This pair of lights includes one light of the row and one light of the column. Consequently, the total number of matrix grid intersections and correspondingly the total number of different light pairs is equal to the multiplicative product of the number of lights in the row times the number of lights in the column.

At each grid intersection of the matrix board, a wire-receiving terminal 36 is positioned and is electrically coupled, both to the corresponding light of the row and to the corresponding light of the column. In this manner, each terminal corresponds to one and only one particular light pair and that light pair corresponds to only that one terminal (grid intersection).

Figure 7:
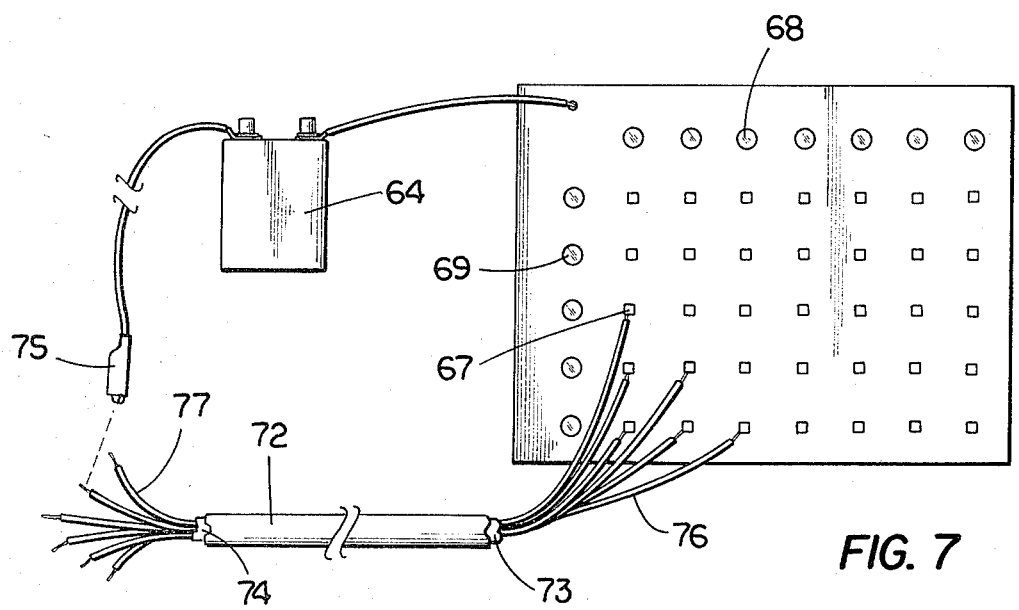
FIG. 7 is a diagrammatic illustration of the manner of use of the FIG. 1 and FIG. 2 wire locator devices.
Figure 6:
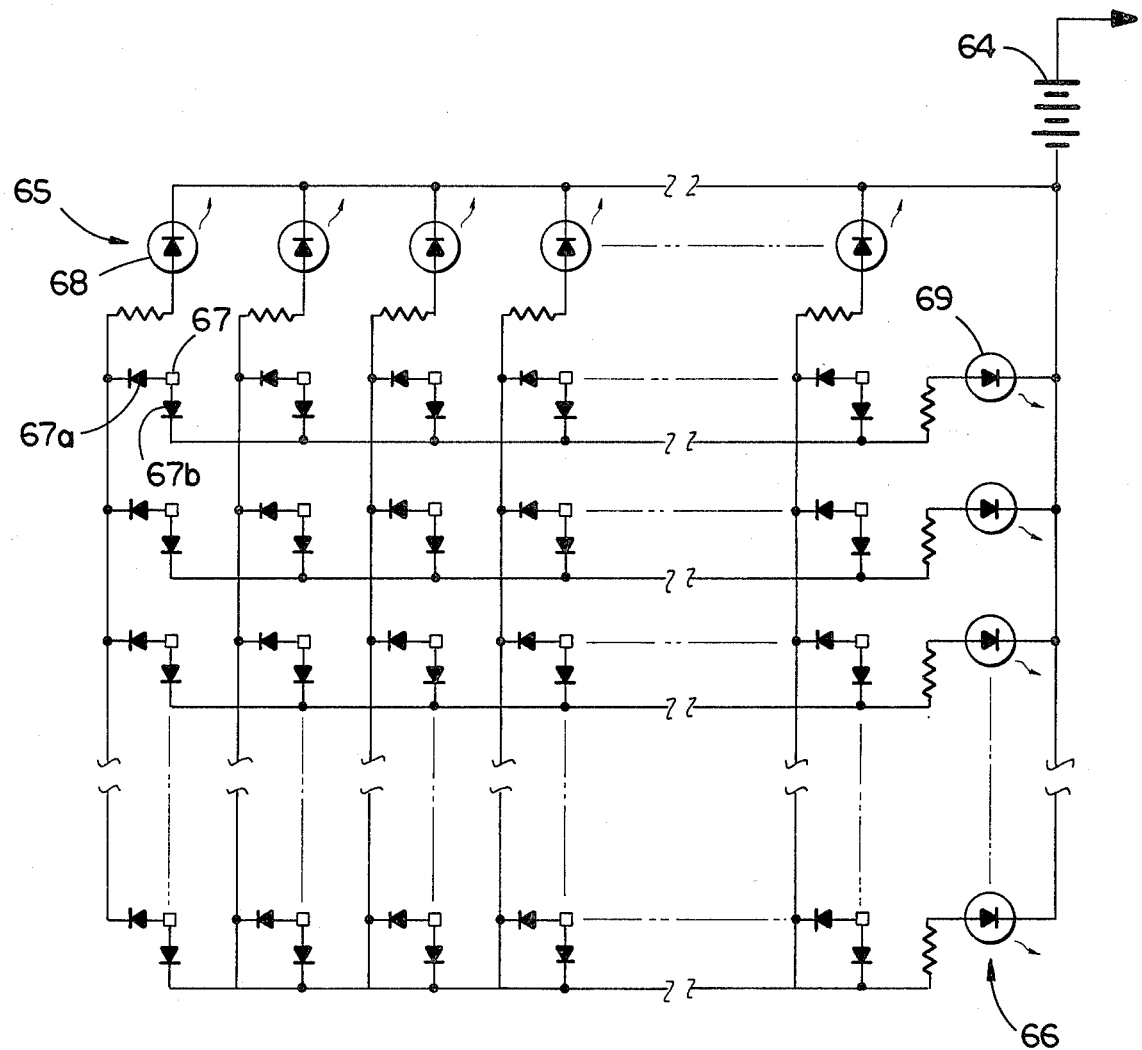
FIG. 6 is a partial, schematic diagram of the FIG. 1 and FIG. 2 wire locator devices.

Matrix board 22 is a glass-phenolic (glass laminate) printed wiring board and is copper clad on one side with the associated electrical components being inserted from the opposite side. The board is fastened to the storage half of the case and the circuitry side is suitably spaced from the case by stand-off members positioned between the board and the case. The wiring connections and circuitry which are associated with the matrix board are illustrated in FIGS. 6 and 7. These figures will be discussed in greater detail hereinafter.

The intended use of device 20 is to locate and identify the conductors (wires) of a conduit system so that the wire end at one end of the conduit can be properly tagged as being part of the same wire which is selected at the opposite end of the conduit. Typical applications involve the initial wiring of machines, appliances, vehicles, aircraft or even buildings. Once all the wires are installed through the conduit, the wires at one end of the conduit are trimmed and numbered for connection to specific points in the equipment or system. It is then desired to properly identify the same wire at the opposite end which in turn may need to be connected to a terminal strip.

The device disclosed herein can accommodate a large number of individual wires with only minimal space and component requirements. For example, a matrix grid with 10 lights in the row and 10 lights in the column can accept 100 different wires. While device 20 is a standard or regular-size unit for large system checkout or benchtop testing, wire locator device 40 (see FIG. 2) provides a more portable, smaller unit which is ideal for on-site checkout and trouble-shooting.

Device 40 is quite similar to device 20 in a number of respects and includes rigid case 41, diode matrix board 42, battery 43 and connection wiring 44. Case 41 includes a lid 47 to which board 42 is rigidly secured and storage tub portion 48, which is considerably deeper than lid 47, is used for storage of the battery and connection wiring as well as other miscellaneous components, supplies, and hand tools. Diode matrix board 42, similar to diode matrix board 22, includes a row 49 of lights 34 and a column 50 of lights 34. The primary difference between device 40 and device 20 is in their size and the location of the corresponding diode matrix board. Device 40 is intended primarily for on-site utilization and the identification and/or trouble-shooting of a limited number of wires. For this reason, diode matrix board 42 is smaller than diode matrix board 22. For example, while diode matrix board 22 may have over 100 grid intersections, matrix board 42 may have only 30 or 40. All other aspects of the electrical operation, wiring and connections are the same between these two devices.

Figure 3:
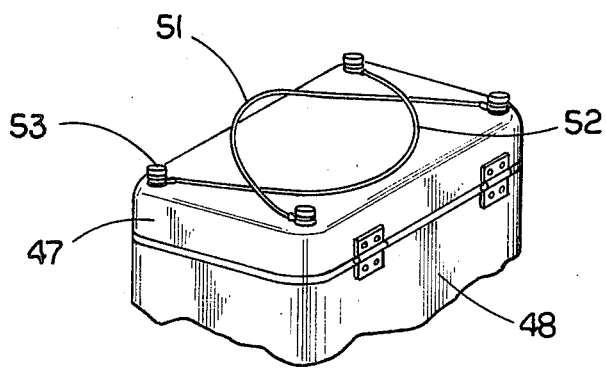
FIG. 3 is a perspective view of the lid portion of the FIG. 2 wire locator device.

There is one important mechanical packaging difference between device 40 and device 20 and that involves the configuration of the corresponding carrying cases. While device 20 is primarily intended for benchtop utilization of a more permanent or fixed nature, device 40 is more suitable for portable usage. To enhance the utilization of device 40 at remote locations such as within a vehicle or aircraft where space may be limited, the lid 47 of device 40 is provided with a pair of hanging straps 51 and 52 (see FIG. 3) which are secured to the corners of lid 47 by fasteners 53. In the exemplary embodiment, these hanging straps are actually lengths of wire rope and these straps may be disposed on hooks or around other objects for orienting device 40 with the lid open in a ready-for-use condition. Consequently, if the individual utilizing device 40 is checking out a control panel or a wiring harness, device 40 may be hung at or near the eye level of the user and the various wiring connections made in a very convenient manner. When one location has been checked and tested, device 40 may be unhooked, closed and transported to the next trouble-shooting site.

Figure 4:
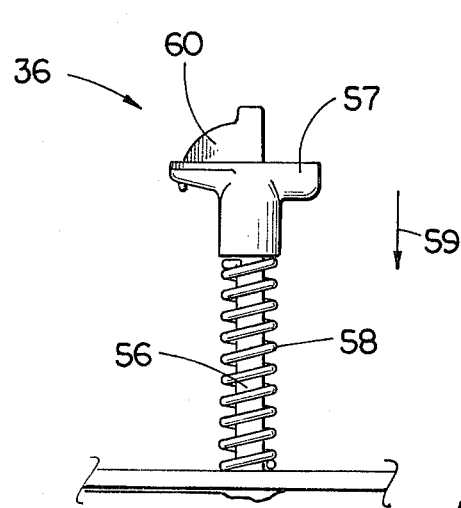
FIG. 4 is a side elevational view of a wire-receiving terminal comprising a portion of the FIG. 1 and FIG. 2 wire locator devices.
Figure 5:
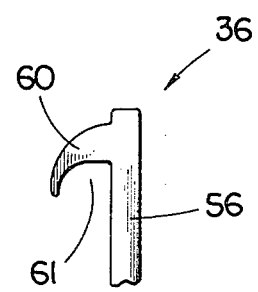
FIG. 5 is a side elevational view of the conductive post portion of the FIG. 4 terminal.

In both matrix board 22 and matrix board 42, the wire-receiving terminals 36 are of the same design and configuration. Each terminal (see FIGS. 4 and 5) includes a center post 56 which is electrically conductive, a synthetic material clip 57 and a spring 58 which cooperates with center post 56 to secure wires thereto in an electrically conductive manner. In order to quick connect and disconnect a wire to terminal 36, clip 57 is pushed downwardly (in the direction of arrow 59) and this reveals hook 60 and recess 61. The end of the wire to be connected to terminal 36 is first stripped and then inserted into recess 61 and clip 57 is then released. The upward movement of clip 57 by means of spring 58 pushes the stripped and bare end of the wire into electrically conductive contact with hook 60. This particular technique allows wires to be quickly connected and disconnected to any of the terminals and contributes to the simplicity, reliability and quickness of utilization of devices 20 and 40.

Referring to FIG. 6, the electrical schematic for either one of the two diode matrix boards is illustrated. Since it is to be understood that the diode matrix boards are virtually identical to each other in all respects, only differing in their particular size of rows and columns, the schematic illustration of FIG. 6 is intended to be generic in nature and broken lines have been included to suggest that the number of lights in the row and in the column and consequently the number of grid intersections can be of virtually any number. The particular schematic arrangement includes a source of electrical power such as battery 64 which is connected in parallel first to each light of row 65 and to each light of column 66. At each grid intersection, a wire-receiving terminal 67 is located and this terminal is coupled to one light 68 of row 65 and to one light 69 of column 66. The utilization of two diodes, for example 67a and 67b, one in each circuit path, prevents the current in each circuit path from "backing up" and passing to other lights than the two to which the terminal corresponds. The resistors incorporated within the circuitry are for limiting the current that is actually received by the lights which in the exemplary embodiment are light-emitting diodes.

Referring to FIG. 7, the actual utilization of devices 20 and 40 can be better appreciated. Beginning with cable or conductor conduit 72, the wires at first end 73 are trimmed and numbered and connected to any of the various terminals 67. The wires at the opposite end 74 of conduit 72 are then sequentially contacted to lead 75 which is connected to one side of battery 64. The opposite side of battery 64 is the side which is electrically wired in parallel to the row of lights 68 and the column of lights 69. If wire end 76 and wire end 77 are in fact the same wire, then when lead 75 is placed in electrical contact with wire end 77, a corresponding pair of lights 68 and 69 which are in vertical and horizontal alignment, respectively, with the terminal to which wire end 76 is connected will illuminate. Since wire end 76 has already been trimmed and numbered, this enables the individual utilizing the device to correspondingly number wire end 77 and properly connect it to a terminal or other desired point of connection. Similarly, as lead 75 contacts each of the remaining wires in the bundle, a different pair of lights, one from the row and one from the column, will illuminate thereby allowing identification of the grid intersection and of that particular wire end.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A portable wire locator device for sequential identification of conductors within a detached, multi-conductor cable, said wire locator device comprising;
   a matrix board having a plurality of wire-receiving terminals arranged into rows and columns;
   a first, linear series of lights arranged adjacent one edge of said matrix board and in line with said wire-receiving terminals;
   a second, linear series of lights arranged adjacent another edge of said matrix board and in line with said wire-receiving terminals, said first and second linear series being substantially perpendicular to each other, said first and second linear series being connected in light pairs wherein one light of each pair is from said first linear series of lights, and wherein the other light of each pair is from the second linear series of lights, a common connection of each light pair being operatively and electrically connected to a different one of said plurality of wire-receiving terminals; and
   a direct-current source of electrical power, one side of which is coupled to each light in said first and second linear series, a particular light pair being illuminated by electrical coupling of the corresponding wire-receiving terminal to the opposite side of said source of electrical power.

2. The wire locator device of claim 1 wherein the total number of different light pairs is equal to the numerical product of the number of lights in said first linear series times the number of lights in said second linear series.

3. The wire locator device of claim 2 wherein each of said plurality of wire-receiving terminals is electrically coupled through a first diode to a different one of the lights in said first linear series and through a second diode to a different one of the lights in said second linear series.

4. The wire locator device of claim 3 which further includes a carrying case, said matrix board being secured within said carrying case and wherein said source of electrical power is a battery, said battery being disposed within said carrying case.

5. The wire locator device of claim 1 wherein each of said plurality of wire-receiving terminals is electrically coupled through a first diode to one light of the corresponding light pair and through a second diode to the other light of the corresponding light pair.

6. The wire locator device of claim 5 wherein each of said plurality of wire-receiving terminals includes a spring-clip retainer disposed on a conductive post that extends upwardly above said matrix board and is substantially perpendicular to the top surface of said matrix board, each of said conductive posts being electrically coupled to its corresponding first and second diodes.

7. The wire locator device of claim 6 wherein said source of electrical power is a battery and the lights comprising said light pairs are light-emitting diodes.

8. The wire locator device of claim 7 which further includes a carrying case arranged with a storage tub and a cooperating lid, said matrix board being secured to said lid and said lid including hanging means for positioning said wire locator device in a variety of locations.

9. A portable wire locator device for electrically making wire identifications of unmarked conduit cable conductors, said wire locator device comprising:
  a matrix board having a plurality of intersections, a column of lights adjacent one edge of said matrix board and a row of lights adjacent another edge of said matrix board, said lights being outward of said intersections and in line therewith, said column and row of lights being connected in pairs;
  a plurality of wire-receiving terminals disposed in said matrix board with a different one of said terminals installed at a different corresponding intersection, each one of said plurality of wire-receiving terminals being electrically coupled to a common connection of each pair of lights, said pair of lights being comprised of one light of said column of lights and one light of said row of lights; and
  a source of direct-current electrical power, one side of which is coupled in parallel to said column of lights and to said row of lights, different ones of said pair of lights being illuminated by coupling the opposite side of said source of power to the corresponding wire-receiving terminal for said pair of lights.

10. The portable wire locator device of claim 9 wherein the lights of said column of lights and the lights of said row of lights are mutually exclusive of each other.

11. The portable wire locator device of claim 9 wherein each of said plurality of wire-receiving terminals is electrically wired in parallel through a first diode to the corresponding light of said column of lights and through a second diode to the corresponding light of said row of lights.

12. The portable wire locator device of claim 11 wherein each of said plurality of wire-receiving terminals includes a spring-clip retainer disposed on a conductive post that extends upwardly above said matrix board and is substantially perpendicular to the top surface of said matrix board, each of said conductive posts being electrically coupled to its corresponding first and second diodes.

13. The portable wire locator device of claim 12 wherein said source of electrical power is a battery and said portable wire locator device further includes a carrying case, said matrix board being secured within said carrying case.

* * * * *